(12) United States Patent
Dominguez et al.

(10) Patent No.: US 7,687,911 B2
(45) Date of Patent: Mar. 30, 2010

(54) SILICON-ALLOY BASED BARRIER LAYERS FOR INTEGRATED CIRCUIT METAL INTERCONNECTS

(75) Inventors: Juan E. Dominguez, Hillsboro, OR (US); Adrien R. Lavoie, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 630 days.

(21) Appl. No.: 11/517,736

(22) Filed: Sep. 7, 2006

(65) Prior Publication Data

US 2008/0064205 A1   Mar. 13, 2008

(51) Int. Cl.
*H01L 21/48* (2006.01)

(52) U.S. Cl. .................. 257/758; 257/761; 257/762; 257/763; 257/765; 257/E23.141

(58) Field of Classification Search ............... 257/751, 257/758, 761–765, 774, E23.141
See application file for complete search history.

(56) References Cited

U.S. PATENT DOCUMENTS

| 6,017,818 A * | 1/2000 | Lu ........................ 438/653 |
| 2002/0137332 A1 * | 9/2002 | Paranjpe et al. ........ 438/637 |
| 2005/0042865 A1 * | 2/2005 | Cabral et al. ........... 438/680 |

\* cited by examiner

*Primary Examiner*—Thanhha Pham
(74) *Attorney, Agent, or Firm*—Rahul D. Engineer

(57) ABSTRACT

A method for forming a silicon alloy based barrier layer comprises providing a substrate having a dielectric layer including a trench, placing the substrate in a reactor, and carrying out a process cycle, wherein the process cycle comprises introducing a silicon containing precursor into the reactor, introducing a metal containing precursor into the reactor, and introducing a co-reactant into the reactor, wherein the silicon, metal, and co-reactant react to form a silicon alloy layer that is conformally deposited on a bottom and a sidewall of the trench.

5 Claims, 10 Drawing Sheets

SILICON-ALLOY BASED BARRIER LAYERS FOR INTEGRATED CIRCUIT METAL INTERCONNECTS

BACKGROUND

In the manufacture of integrated circuits, copper interconnects are generally formed on a semiconductor substrate using a copper dual damascene process. Such a process begins with a trench being etched into a dielectric layer and filled with a barrier layer, an adhesion layer, and a seed layer. A physical vapor deposition (PVD) process, such as a sputtering process, may be used to deposit a tantalum nitride (TaN) barrier layer and a tantalum (Ta) or ruthenium (Ru) adhesion layer (i.e., a TaN/Ta or TaN/Ru stack) into the trench. The TaN barrier layer prevents copper from diffusing into the underlying dielectric layer. The Ta or Ru adhesion layer is required because the subsequently deposited metals do not readily adhere or nucleate on the TaN barrier layer. This may be followed by a PVD sputter process to deposit a copper seed layer into the trench. An electroplating process is then used to fill the trench with copper metal to form the interconnect.

As device dimensions scale down, the aspect ratio of the trench becomes more aggressive as the trench becomes narrower. This gives rise to issues such as trench overhang during the copper seed deposition and plating processes, leading to pinched-off trench openings and inadequate electroplating gapfill. Additionally, as trenches decrease in size, the ratio of barrier metal to copper metal in the overall interconnect structure increases, thereby increasing the electrical line resistance and RC delay of the interconnect.

One approach to addressing these issues is to reduce the thickness of the TaN/Ta or TaN/Ru stack, which widens the available gap for subsequent metallization and increases the final copper volume fraction. If a physical vapor deposition (PVD) deposition is used to form a thinner barrier layer, the line of sight deposition does not allow good sidewall coverage at aggressive geometries. As a result, the barrier layer occupies a significant amount of volume of the interconnect (e.g., greater than 20%), which increase the electrical resistance of the metal interconnect. Current atomic layer deposition (ALD) barriers are nitrided barriers with some carbon, and pure copper does not adhere or nucleate well to such layers, thereby causing adhesion issues and potential electromigration failures at short stress times. Accordingly, alternative techniques for reducing the thickness of the barrier and adhesion layer are needed.

DETAILED DESCRIPTION

Described herein are systems and methods of forming a silicon-alloy based barrier layer for integrated circuit metal interconnect applications. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention include a metal interconnect, such as a copper interconnect, that is formed on a silicon-alloy (Si-alloy) layer. The Si-alloy layer is a single layer that replaces the conventional TaN/Ta or TaN/Ru stack. The Si-alloy layer has dual functionality: it functions as a barrier layer to prevent the diffusion of metal into an underlying dielectric layer and it functions as an adhesion layer for the deposition of metal to form the metal interconnect. The metal interconnect may be used in integrated circuit applications, for instance, in back-end metallization layers that interconnect various devices formed on a semiconductor substrate. The Si-alloy layer may be a graded layer such that the concentration of silicon and/or metal varies across the thickness of the layer.

Figure 1A:
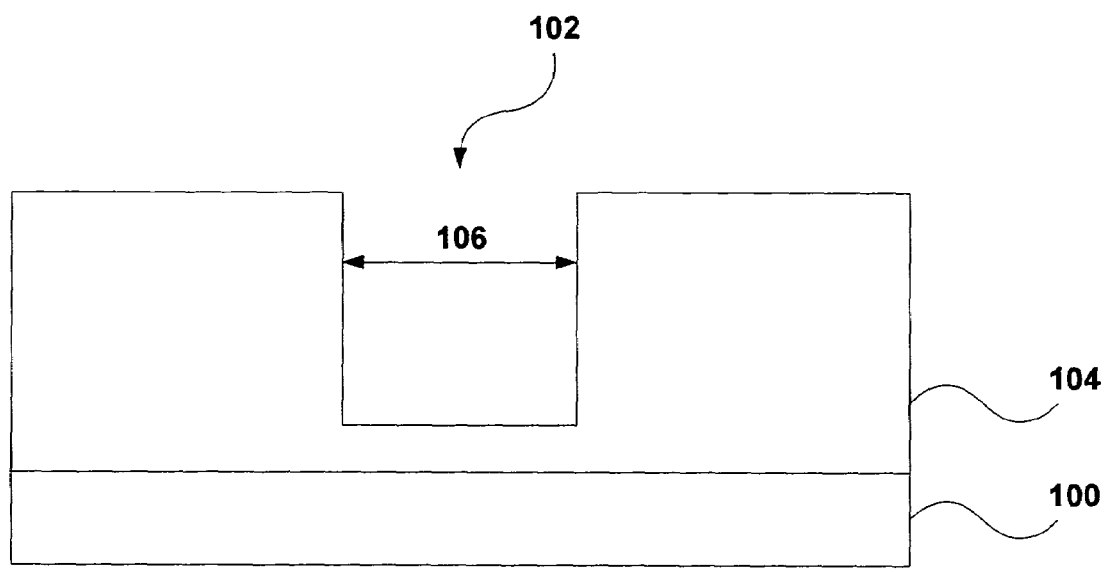
FIGS. 1A to 1E illustrate a conventional damascene process for forming metal interconnects.

For reference, FIGS. 1A to 1E illustrate a conventional damascene process for fabricating copper interconnects on a semiconductor wafer. FIG. 1A illustrates a substrate 100, such as a semiconductor wafer, that includes a trench 102 that has been etched into a dielectric layer 104. The trench 102 includes a gap 106 through which metal may enter during metallization processes.

Figure 1B:
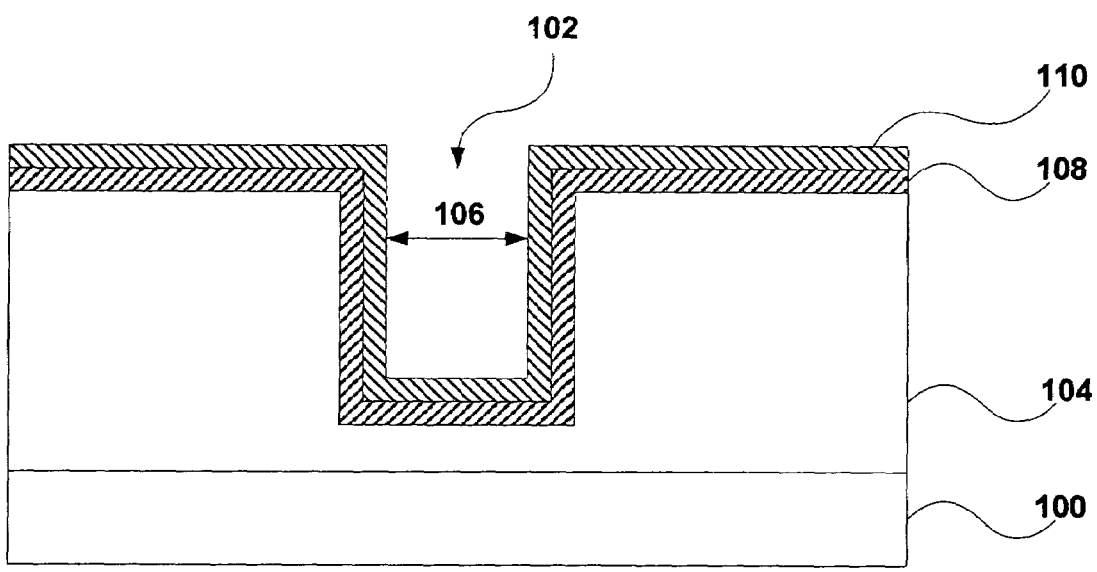

FIG. 1B illustrates the trench 102 after a conventional barrier layer 108 and a conventional adhesion layer 110 have been deposited. The barrier layer 108 prevents copper metal from diffusing into the dielectric layer 104. The adhesion layer 110 enables copper metal to become deposited onto the barrier layer 108. The barrier layer 108 is generally formed using a material such as tantalum nitride (TaN) and is deposited using a PVD process. The barrier layer 108 may be around 5 Angstroms (Å) to 10 nanometers (nm) thick, although it is generally around 5 nm thick. The adhesion layer 110 is generally formed using a metal such as tantalum (Ta) or ruthenium (Ru) and is also deposited using a PVD process. The adhesion layer 110 is generally around 0.5 nm to 10 nm thick.

After the adhesion layer 110 is formed, the conventional damascene process of FIG. 1 uses two independent deposition processes to fill the trench 102 with copper metal. The first deposition process is a PVD process that forms a non-conformal copper seed layer. The second deposition process is a plating process, such as an electroplating (EP) process or an electroless plating (EL) process, that deposits a bulk copper layer to fill the trench 102. Alternatively, atomic layer deposition (ALD) or chemical vapor deposition (CVD) copper processes may be used to deposit the copper seed layer and/or to fill the trench 102.

Figure 1C:
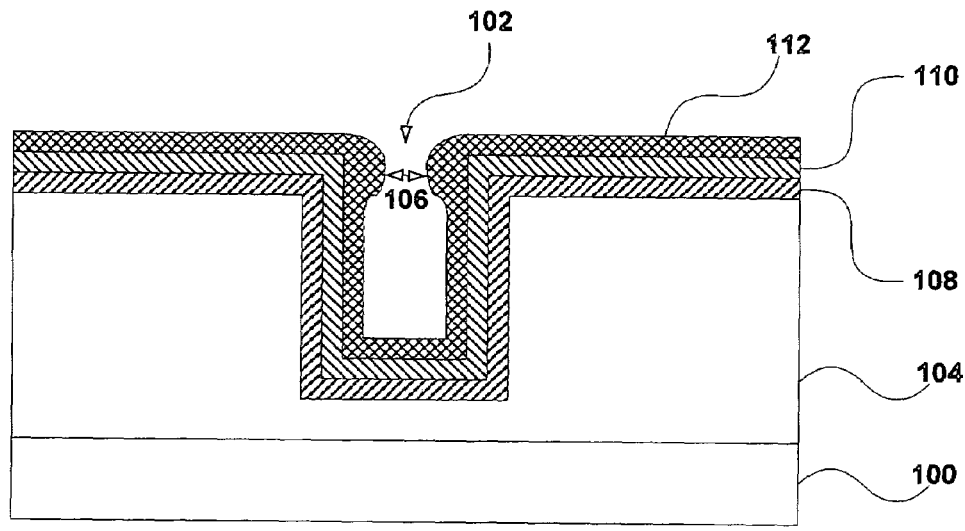
Figure 1D:
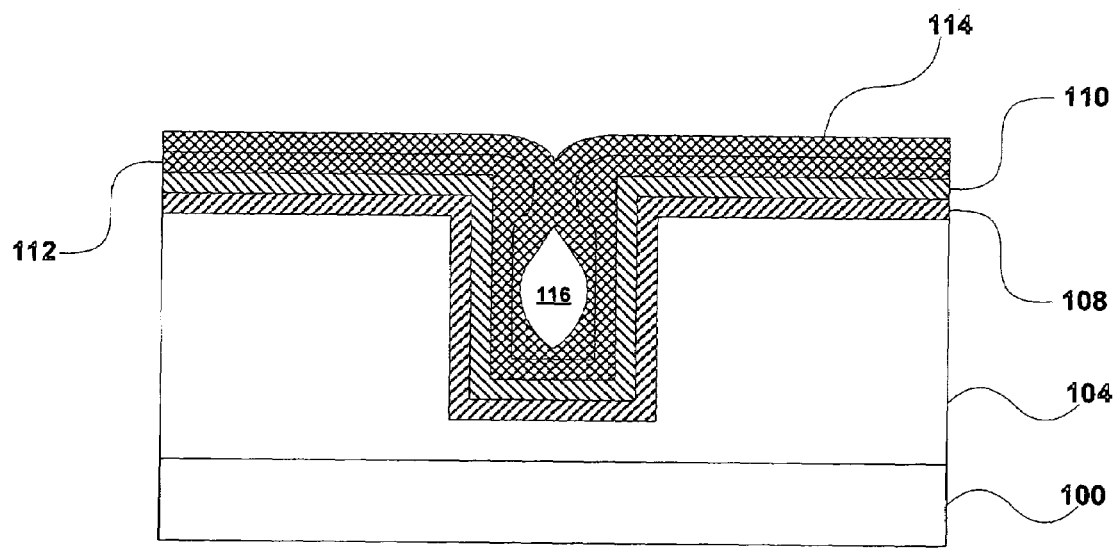

FIG. 1C illustrates the trench 102 after a conventional copper seed layer 112 has been deposited onto the adhesion layer 110 using a PVD process. The copper seed layer 112 enables or catalyzes a subsequent plating process to fill the interconnect with copper metal. FIG. 1D illustrates the trench 102 after an EP or EL copper deposition process has been carried out. Copper metal 114 enters the trench through the gap 106 where, due to the narrow width or pinched off feature of the gap 106, issues such as trench overhang and pinching off of the trench opening may occur that lead to defects. For instance, as shown in FIG. 1D, trench overhang may occur that pinches off the opening of the trench 102, creating a void 116 that will appear in the final interconnect structure.

Figure 1E:
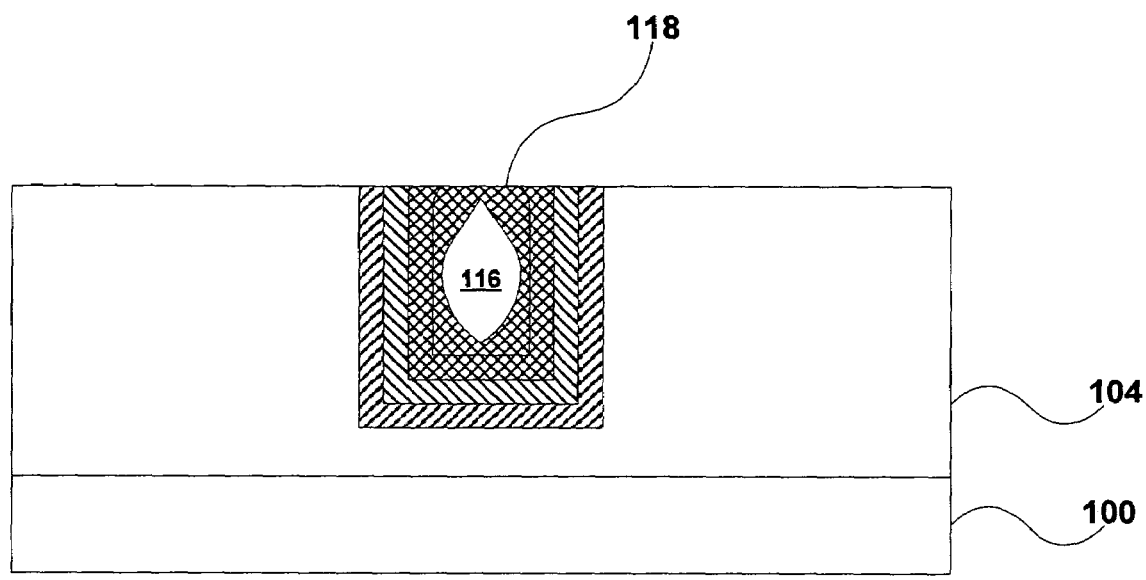

FIG. 1E illustrates the trench 102 after a chemical mechanical polishing (CMP) process is used to planarize the deposited copper metal 114. The CMP results in the formation of a metal interconnect 118. As shown, the metal interconnect 118 includes the void 116 that was formed when the available gap 106 was too narrow and the resulting trench overhang pinched off the trench opening. Furthermore, a substantial portion of the metal interconnect 118 comprises Ta and/or Ru from the adhesion layer 110 and the barrier layer 108.

Implementations of the invention provide methods for producing a Si-alloy layer that provides both barrier layer functionality and adhesion layer functionality in a single, thin layer. This dual-functionality, coupled with the thinness of the layer, provides more room for copper deposition to fabricate metal interconnects and enables the integration of barrier layers into 32 nm nodes and below. In further implementations, the Si-alloy layer may also serve as a material to seal the pores of an ultralow-k dielectric material. In some implementations of the invention, the Si-alloy layer may be a homogenous layer incorporating silicon, nitrogen, and metal. In alternate implementations of the invention, the Si-alloy layer may be a graded or laminated layer where the concentrations of silicon, nitrogen, and/or metal vary throughout the thickness of the layer.

Figure 2A:
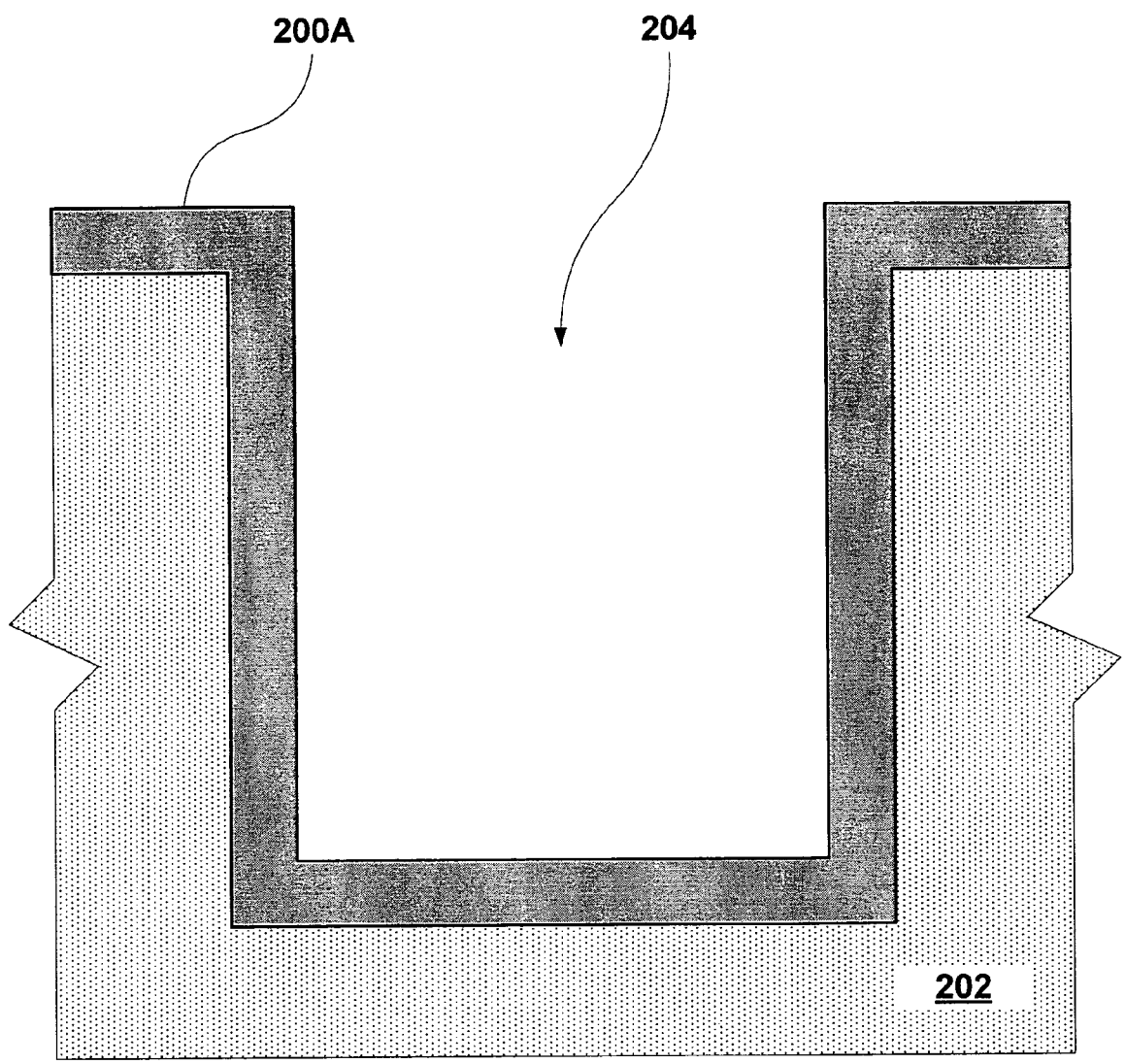
FIG. 2A illustrates a homogenous Si-alloy layer formed in accordance with an implementation of the invention.

FIG. 2A illustrates one implementation of a Si-alloy layer 200, more specifically, a homogenous Si-alloy layer 200A having the composition $M_x$SiN. The $M_x$ represents metal, Si represents silicon, and N represents nitrogen. The Si-alloy layer 200A is fabricated upon a dielectric layer 202 that includes a trench 204. The Si-alloy layer 200A is a conformal layer, therefore, the layer 200A lines the sidewalls and bottom of the trench 204. In implementations of the invention, the Si-alloy layer 200A may have a thickness that ranges from 5 Angstroms (Å) to 50 Å, with the typical thickness being around 10 Å to 30 Å. When deposited using the methods described below, the Si-alloy layer 200A is generally a conformal, continuous, dense, and uniform layer.

The metal in the Si-alloy layer 200A may serve several functions. One such function is preventing the diffusion of metal into the dielectric layer. For instance, if a copper interconnect is formed upon the Si-alloy layer 200A, the metal within the layer 200A acts as a barrier to prevent the copper from diffusing into the dielectric layer 202. Barrier metals that may be used in the Si-alloy layer 200A to prevent diffusion include, but are not limited to, aluminum (Al), ruthenium (Ru), iridium (Ir), cobalt (Co), titanium (Ti), or tantalum (Ta). Another function of the metal in the Si-alloy layer 200A is to serve as an adhesion layer for the subsequently formed metal interconnect. For instance, if a copper layer is to be deposited to fabricate the interconnect, the metal in the Si-alloy layer 200A may function as an adhesion layer for copper.

Figure 2B:
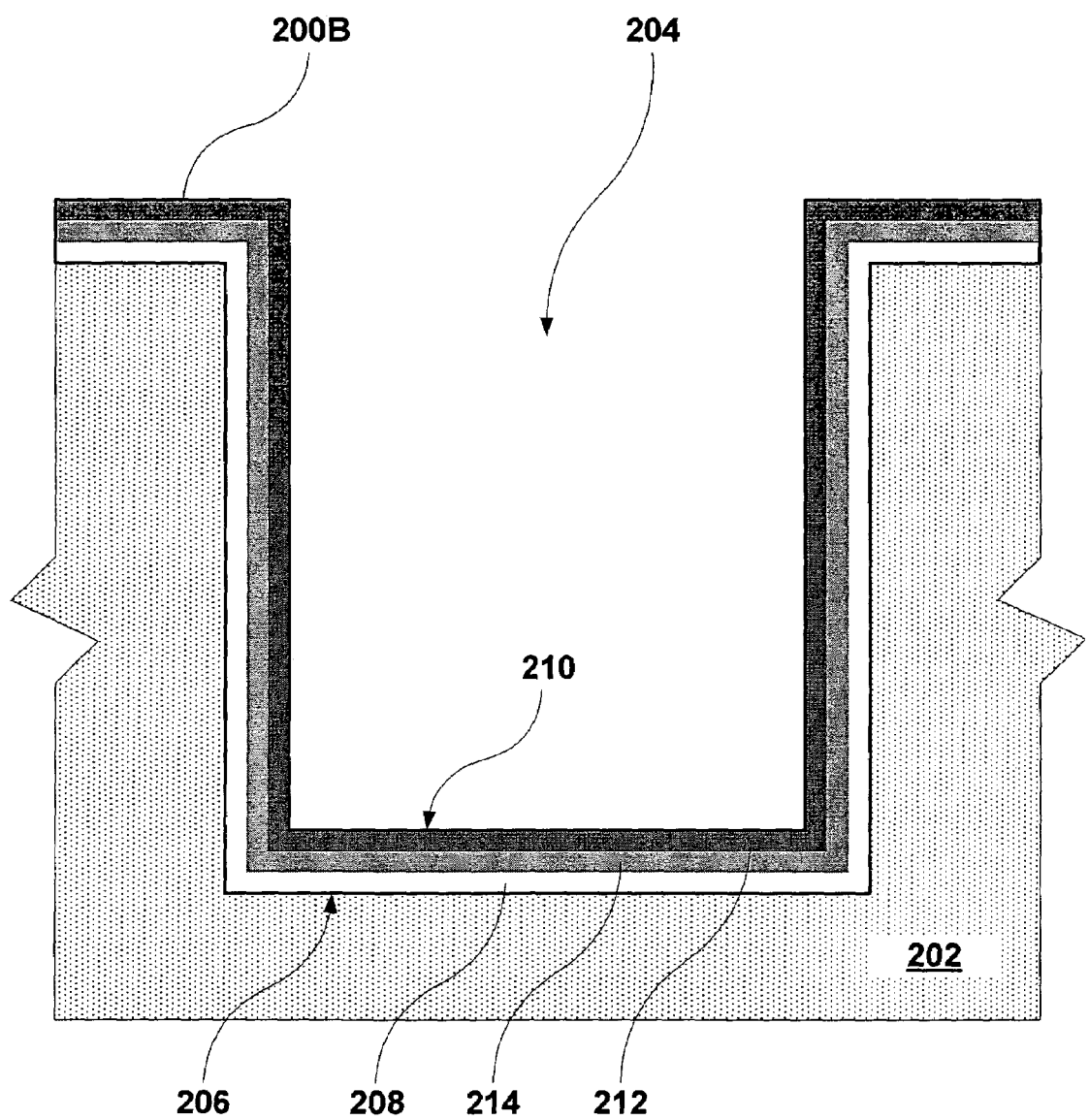
FIG. 2B illustrates a graded Si-alloy layer formed in accordance with an implementation of the invention.

FIG. 2B illustrates another implementation of the Si-alloy layer 200, more specifically, a graded Si-alloy layer 200B that includes varying concentrations (e.g., concentration gradients) of metal, silicon, and/or nitrogen across the thickness of the layer. As above, the thickness of the layer 200B may range from 5 Å to 50 Å, with the typical thickness being around 10 Å to 30 Å. The Si-alloy layer 200B is fabricated upon the dielectric layer 202 that includes the trench 204. Again, as a conformal layer, the Si-alloy layer 200B lines the sidewalls and bottom of the trench 204.

In an implementation of the invention, the graded concentrations of silicon and nitrogen in the Si-alloy layer 200B may be highest proximate a surface 206 of the Si-alloy layer 200B that is adjacent to the dielectric layer 202. For instance, a portion 208 of the layer 200B that is at or near the surface 206 may consist substantially of nitrided silicon (SiN), while the concentration of metal in this portion may be low or substantially zero. The presence of silicon tends to reduce the impact of the barrier layer on the overall dielectric constant of the dielectric layer 202 and improves adhesion of the layer 200B to the dielectric layer 202. The nitrided silicon further functions as a barrier layer to prevent copper metal from diffusing into the dielectric layer 202. The concentrations of silicon and nitrogen may decrease across the thickness of the Si-alloy layer 200B until their concentrations are low or substantially zero at a surface 210 of the Si-alloy layer 200B.

The concentration of metal in the Si-alloy layer 200B may follow a gradient that is contrary to the gradients for silicon and nitrogen. In other words, the highest metal concentration may be found proximate the surface 210 of the Si-alloy layer 200B, which will be adjacent to a subsequently deposited metal interconnect. A portion 212 of the layer 200B that is at or near the surface 210 may substantially or completely consist of metal while the concentration of nitrided silicon is substantially zero. At the surface 210, the metal functions as an adhesion layer and possibly as a seeding layer for the subsequent deposition of metal to form the metal interconnect. For instance, if copper metal is used for the interconnect, the metal in portion 212 may be a seed layer or may function as an adhesion layer. Metals that may be used here include, but are not limited to, Cu, Al, Ru, Ir, Co, Ti, and Ta. The concentration of metal may then decrease across the thickness of the Si-alloy layer 200B until the concentration of metal is low or substantially zero at the surface 206.

A middle portion 214 of the Si-alloy layer 200B consists primarily of $M_x$SiN. In implementations of the invention, a CVD or ALD process used to form the Si-alloy layer 200B deposits $M_x$SiN after the deposition of the SiN and before the deposition of the metal, thereby allowing the SiN-rich portion 208 to transition into the metal-rich portion 212. The presence of $M_x$SiN binds the SiN-rich portion 208 to the metal-rich portion 212 and allows a medium for some typical mixing and interdiffusion to occur. The concentration of $M_x$SiN throughout the middle portion 214 depends on what the exact concentration gradients of silicon, nitrogen, and metal look like, as these concentration gradients are defined during the deposition process for the Si-alloy layer 200B.

Use of the graded Si-alloy layer 200B therefore enables the deposition of a single layer that provides both barrier layer functionality and adhesion layer functionality without the need for volume consuming stacked TaN/Ta layers. Having a single layer that performs both functions will enable further interconnect scaling by providing more margin for copper gapfill to form the actual interconnect structure.

The Si-alloy layer 200 may be formed using an ALD or CVD process. Silicon containing precursors and metal containing precursors may be used to form the Si-alloy layer 200. In the various implementations of the invention, pure metal precursors include metal containing carbonyls, cyclic arenes, beta-diketonates, alkyls, cyclopentadienyls (Cp), and amidinates. Silicon precursors include silane and derivatives thereof, including but not limited to siloxanes and derivatives. Silicon nitride precursors include, but are not limited to, $Si(NMe_2)_xH_y$ (where $0 \leq x \leq 4$ and $0 \leq y \leq 4$), $Si(NMe_2)_4$, $SiH_4+NH_3$, and $SiH_4+N_2H_4$, where Me=methyl.

In implementations of the invention where the Si-alloy layer 200 includes aluminum, novel precursors that may be used include, but are not limited to, methylpyrrolidinealane (MPA), $AlMe_2(C≡CSiMe_3)$, $AlBu^i_2\{CH(Me)SiEt_3\}$, $AlBu^i_2\{C(SiMe_3)=CHPh\}$, $Al(SiMe_3)_3$, $Al(CH_2SiMe_3)_3$, $Al(CH_2CH_2CH_2SiMe_3)_3$, $\{AlMe_2(OSiMe_3)_2\}_2$, $(Me_3SiCH_2)_2AlH$, $Al(CH_2SiMe_3)_2(NHMe)$, $(Me_3Si)_2NAlEt_2$, and $Me_2Al(NHSiMe_3)$, where Bu=butyl, Et=ethyl, and Ph=phenyl.

In implementations of the invention where the Si-alloy layer 200 includes ruthenium, novel precursors that may be used include, but are not limited to, dimers or oligomers of the general formula $Ru_x(CO)_y$, $(Me_2Cp)_2Ru$, $(EtCp)(MeCp)Ru$, $(EtCp)(2,4$-dimethylpentadienyl$)Ru$, $(pyrrolyl)(EtCp)Ru$, Cp'Ru(arene)R (where Cp' is a cyclopentadienyl ring), $Ru_2(CO)_5(C_8H_7SiMe_3)$, $Ru_2(CO)_6(C_8H_7SiMe_3)$, $\{Ru(CO)_4\}_2SiMe_2OSiMe_2$, $\{Ru(SiMe_3)(CO)_4\}_2$, $\{Cp(CO)_2RuSiMe_2CH_2\}_2$, and $\{Ru(SiMe_2)(SiMe_3)(CO)_3\}_2$. In other cases, the Cp can be replaced by rings with N heteroatoms (e.g. pyrrolyl) to obtain a RuSiN Si-alloy layer 200.

In implementations of the invention where the Si-alloy layer 200 includes iridium, novel precursors that may be used include COD(Ir)(TMS-amidinate), where COD=cyclooctadiene and where TMS=trimethylsilyl.

In implementations of the invention where the Si-alloy layer 200 includes tantalum, novel precursors that may be used include, but are not limited to, $[(Me_3Si)_2N]_2TaClNC(CH_3)_3$, $[(Me_3Si)_2NTaBr_2(NSiMe_3)]_2$, $TaCl_2(CH_2SiMe_3)_3$, $Ta[N(CH_3)_2]_5$, $Ta(CH_2SiMe_3)(CHSiMe_3)[N(SiMe_3)_2]_2$, and $Ta[(CH_2SiMe_3)_2(CSiMe_3)]_2$.

In implementations of the invention where the Si-alloy layer 200 includes cobalt, novel precursors that may be used include, but are not limited to, bis(N,N'-di-sec-butylacetamidinato)cobalt, bis(N,N'-di-isopropylacetamidinato)cobalt, bis(N,N'-di-isopropyldimethylaminoacetamidinato)cobalt, bis(cyclopentadienyl)cobalt(II) ("cobaltocene"), cyclopentadienylcobalt dicarbonyl, cobalt acetylacetonate, cobalt tricarbonyl nitrosyl, bis(N,N'-diisopropylacetamidinato)cobalt (II), Tris(2,2,6,6-tetramethyl-3,5-heptanedionato)cobalt(III), $CoCp[PhB(C_2H_2)_2SiMe_2]$ and $Co_2(CO)_4(HC≡CSiMe_3)_3$.

In implementations of the invention where the Si-alloy layer 200 includes titanium, novel precursors that may be used include, but are not limited to, $TiCl_4$, $Ti(SiMe_3)_4$, $Ti(CH_2SiMe_3)_4$, $Cp_2Ti[N(SiMe_3)_2]_2$, and $Ti[N(SiMe_3)_2]_3$.

Figure 3:
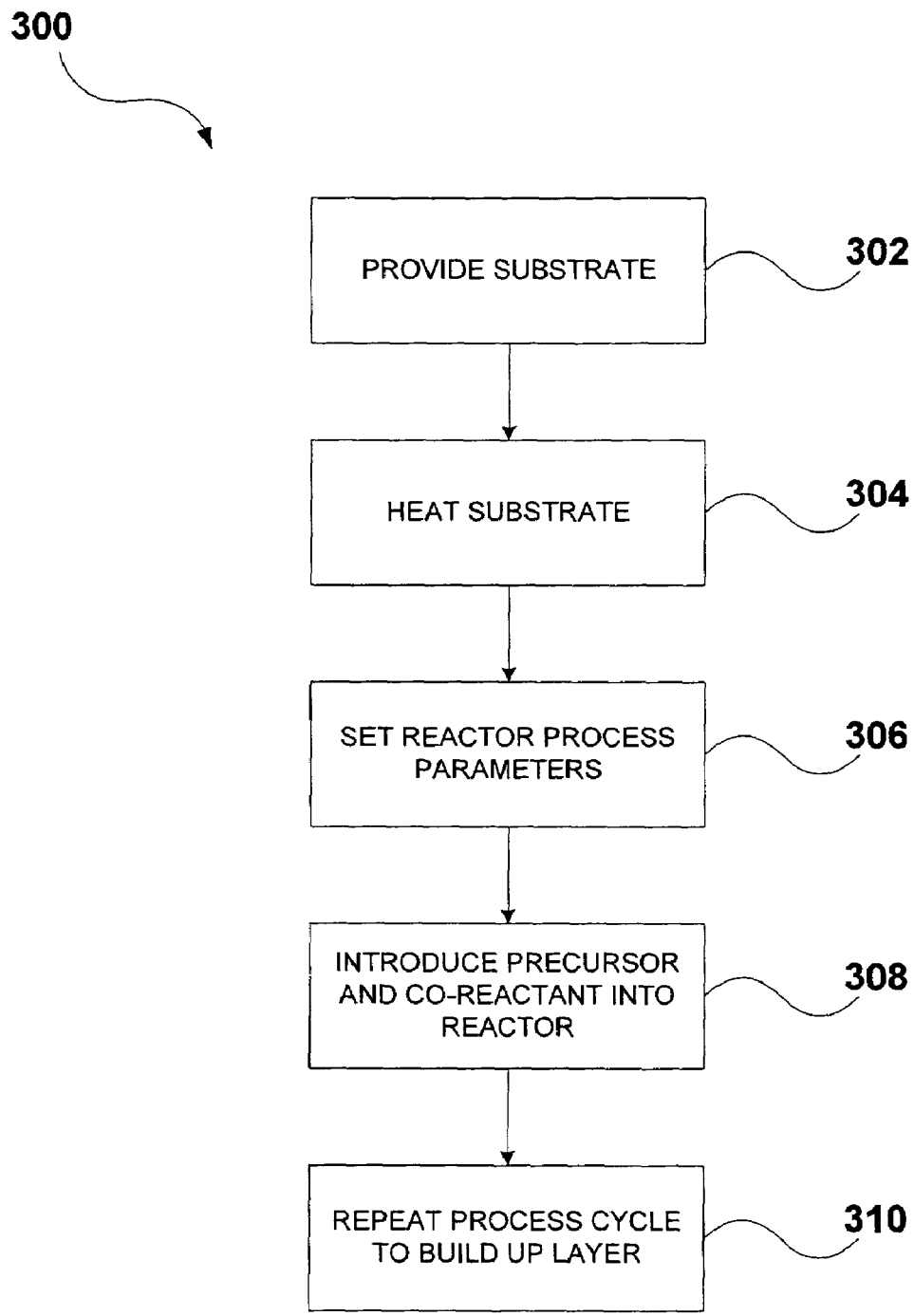
FIG. 3 is a CVD method for fabricating a homogenous Si-alloy layer in accordance with an implementation of the invention.

FIG. 3 is a CVD method 300 for fabricating a homogenous Si-alloy layer 200A in accordance with an implementation of the invention. First, a substrate is provided in a reactor (302). The substrate may include, but is not limited to, a semiconductor wafer having at least one dielectric layer deposited on its surface. The dielectric layer may include one or more trenches and/or vias within which the Si-alloy layer will be deposited and the copper interconnect will be formed.

In implementations of the invention, the substrate may be heated to a temperature that ranges from 50° C. to 400° C. (304). Precursor and co-reactant delivery lines into the reactor may be heated to a temperature that ranges from 25° C. to 150° C., or alternately, to a temperature that is at least 25° C. hotter than the volatile precursor and co-reactant flow temperatures within the delivery lines to avoid condensation of the precursor and/or the co-reactant. In addition, the process parameters for the reactor may be set, such as heating the reactor to a temperature that ranges from 50° C. to 400° C. and establishing a pressure within the reactor that ranges from 0.1 Torr to 10 Torr (306).

Next, a process cycle is carried out in which at least one precursor and at least one co-reactant are introduced into the reactor to react and form a Si-alloy layer (308). The process cycle may introduce the precursor and the co-reactant into the reactor in discrete pulses or in a continuous manner. The at least one precursor is chosen from the precursors listed above, and as shown, the precursor generally includes silicon and a metal. The at least one co-reactant may include, but is not limited to, hydrogen ($H_2$), $SiH_4$, $NH_3$, $N_2H_4$, $B_2H_6$, $CH_4$, 5% $H_2$ in 95% $N_2$, and CO.

The silicon and metal may be introduced using different mechanisms. For instance, in one implementation, a single precursor may be chosen that includes both the silicon and the metal. The silicon and metal may be provided in the same input stream to the reactor. The co-reactant may be introduced simultaneously by way of the same input stream as the precursor or by way of a different input stream.

In another implementation of the invention, separate silicon and metal precursors may be chosen. Providing separate silicon and metal precursors enables predetermined silicon-to-metal ratios to be generated within the Si-alloy layer, thereby fabricating a Si-alloy layer with known silicon and metal quantities. In some implementations, the silicon precursor may be introduced in a first input stream to the reactor and the metal precursor may be separately introduced in a second input stream to the reactor. Alternately, the two or more precursors may be combined and introduced in the same input stream. The silicon precursor and the metal precursor may be introduced into the reactor simultaneously. The co-reactant may be introduced at the same time as the multiple precursors and may be provided in the same input stream as one or both of the precursors or may be provided in a separate input stream.

In various implementations of the invention, each precursor flowrate may range from 0.5 standard liters per minute (SLM) to 5 SLM. The co-reactant flowrate may range from 0.5 SLM to 5 SLM. Furthermore, one or more carrier gases may be used to transport the precursor and/or the co-reactant into the reactor, and in implementations of the invention, carrier gases such as argon, helium, $N_2$, or 5% $H_2$ in 95% $N_2$ may be used.

In some implementations of the invention, a plasma or activated species for either one or both of the precursor and co-reactant may be used. For instance, a plasma discharge may be developed using a 13.56 MHz RF power generator. Other RF frequencies and/or modes of plasma generation may also be effective, such as 27 MHz or 60 MHz. In implementations of the invention, a plasma source such as a radio frequency source, a direct current source, a pulsed direct current source, a capacitatively coupled source, or a microwave source may be used. The plasma discharge may be operated either remotely or directly. In an implementation using a direct capacitively coupled plasma, the reactor may use a parallel plate configuration. Using this configuration, the plasma may be operated with a power density from 0.01

W/cm² to 10 W/cm². The optimum power density may be selected based on the process performance and layer properties.

Under the conditions described, the precursor and the co-reactant tend to react and form a homogenous Si-alloy layer, such as Si-alloy layer 200A, atop the substrate surface. Although the deposited Si-alloy layer will be relatively thin, the layer will have highly conformal coverage given that the precursor deposition occurs through this CVD process. Multiple process cycles may be carried out to build up a Si-alloy layer of a desired thickness (310).

Figure 4:
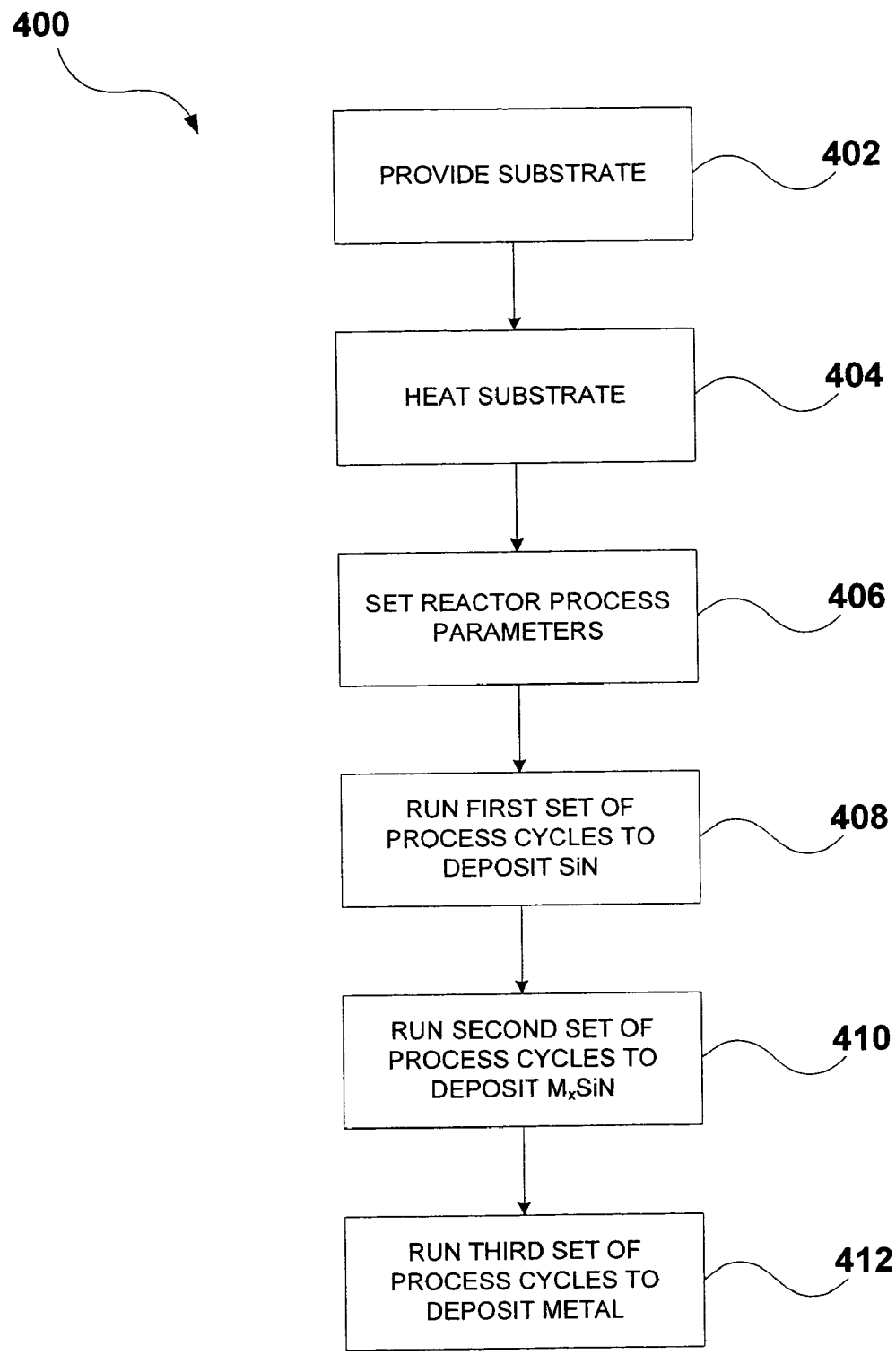
FIG. 4 is a CVD method for fabricating a graded Si-alloy layer in accordance with another implementation of the invention.

FIG. 4 is a CVD method 400 for fabricating a graded Si-alloy layer 200B in accordance with another implementation of the invention. First, a substrate is provided in a reactor (402). The substrate may include, but is not limited to, a semiconductor wafer having at least one dielectric layer deposited on its surface. The dielectric layer may include one or more trenches and/or vias within which the Si-alloy layer will be deposited and the copper interconnect will be formed.

In implementations of the invention, the substrate may be heated to a temperature that ranges from 50° C. to 400° C. (404). Precursor and co-reactant delivery lines into the reactor may be heated to a temperature that ranges from 25° C. to 150° C., or alternately, to a temperature that is at least 25° C. hotter than the volatile precursor and co-reactant flow temperatures within the delivery lines to avoid condensation. In addition, the process parameters for the reactor may be set, such as heating the reactor to a temperature that ranges from 50° C. to 400° C. and establishing a pressure within the reactor that ranges from 0.1 Torr to 10 Torr (406).

Next, multiple process cycles are carried out in which silicon and metal precursors and at least one co-reactant are introduced into the reactor to react and form a graded Si-alloy layer. The silicon and metal precursors are chosen from the precursors listed above. The at least one co-reactant may include, but is not limited to, $H_2$, $SiH_4$, $NH_3$, $N_2H_4$, $B_2H_6$, $CH_4$, 5% $H_2$ in 95% $N_2$, and CO.

In implementations of the invention, the process parameters for the multiple process cycles may be varied to change the composition of the Si-alloy layer across its thickness. For instance, changing the parameters of each individual process cycle, or groups of successive process cycles, may be used to fabricate a Si-alloy layer that is graded and/or has certain desired physical properties. Such physical properties include, but are not limited to, tailored silicon, nitrogen, and metal concentrations as well as silicon, nitrogen, and/or carbon gradients within the Si-alloy layer. Process parameters that may be manipulated include, but are not limited to, the precursors that are used in each process cycle, the number of precursor pulses in each process cycle, the precursor concentration in each pulse, the precursor flowrate in each pulse, the precursor pulse time duration, the co-reactant used, the number of co-reactant pulses in each process cycle, the co-reactant concentration in each pulse, the co-reactant flowrate in each pulse, the co-reactant pulse time duration, the sequence or order of the precursor and co-reactant pulses, the plasma energy applied (if any), the substrate temperature, the pressure within the reaction chamber, and the carrier gas composition.

In one implementation of the invention, a graded Si-alloy layer may be formed by first manipulating the process parameters for a first set of process cycles to deposit silicon and nitrogen rich material adjacent to the dielectric layer (408). The precursor chosen for this first set of process cycles may be a silicon precursor that does not include metal. The co-reactant may include some form of nitrogen. Alternately, the nitrogen may be introduced in the precursor molecule as a Si—N bond. The first set of process cycles therefore deposits a material on the dielectric layer that is composed primarily of SiN.

Next, the process parameters for a second set of process cycles may be manipulated to deposit material rich in silicon, nitrogen, and metal (410). The precursors for this second set of process cycles may include separate silicon and metal precursors. The separate precursors may be introduced in separate input streams. Alternately, a precursor may be selected that includes both silicon and metal. The nitrogen may be introduced by way of a precursor or a co-reactant. This second set of process cycles deposits $M_xSiN$ material atop the SiN material.

Finally, the process parameters for a third set of process cycles may be manipulated to deposit material that is substantially comprised of metal with little or no silicon and nitrogen (412). The precursor for this third set of process cycles may be a pure metal precursor. This third set of process cycles therefore deposits a substantially pure metal atop the $M_xSiN$ material. The final result is a graded Si-alloy layer having barrier layer functionality adjacent to the dielectric layer and adhesion layer functionality adjacent to a subsequently deposited seed layer, as well as pore sealing functionality, similar to the Si-alloy layer 200B shown in FIG. 2B.

In another implementation of the invention, a graded Si-alloy layer may be formed by manipulating the process parameters of a first set of process cycles to deposit silicon, metal, and nitrogen rich material (e.g., $M_xSiN$) adjacent to the dielectric layer. The process parameters of a second set of process cycles may then be manipulated to deposit material rich in metal with little or no silicon and nitrogen. The final result is a graded Si-alloy layer that is substantially composed of a silicon-metal-nitrogen alloy with a pure metal portion for adhesion layer functionality.

Figure 5:
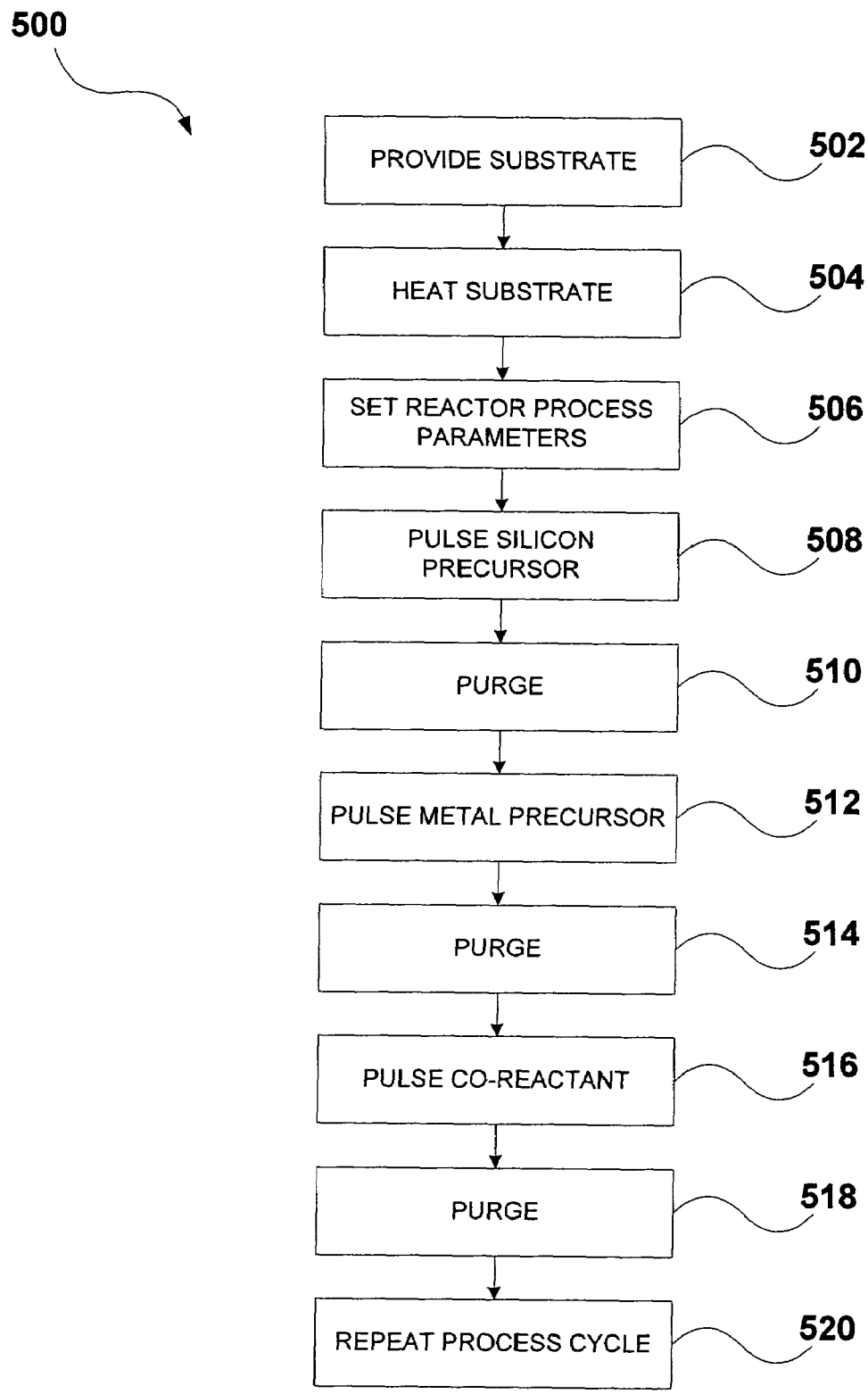
FIG. 5 is an ALD method for fabricating a homogenous Si-alloy layer in accordance with an implementation of the invention.

FIG. 5 is an ALD method 500 for fabricating a homogenous Si-alloy layer 200A in accordance with an implementation of the invention. First, a substrate is provided in a reactor (502). The substrate may include, but is not limited to, a semiconductor wafer having at least one dielectric layer deposited on its surface. The dielectric layer may include one or more trenches and/or vias within which the Si-alloy layer will be deposited and the copper interconnect will be formed.

In implementations of the invention, the substrate may be heated to a temperature that ranges from 50° C. to 400° C. (504). In addition, the process parameters for the reactor may be set, such as heating the reactor to a temperature that ranges from 50° C. to 400° C. and establishing a pressure within the reactor that ranges from 0.1 Torr to 10 Torr (506). Next, multiple process cycles are carried out in which at least one precursor and at least one co-reactant are introduced into the reactor to react and form a Si-alloy layer. Each precursor and each co-reactant may be introduced in separate pulses and the reactor is generally purged between pulses.

In one implementation of the invention, a process cycle may begin with a pulse of a silicon precursor (508). The silicon precursor may be chosen from the precursors provided above. The silicon precursor delivery line into the reactor may be heated to a temperature that ranges from 25° C. to 150° C., or alternately, to a temperature that is at least 25° C. hotter than the volatile silicon precursor flow temperature within the delivery line to avoid condensation. The silicon precursor pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The reactor may be purged after the silicon precursor pulse (510). An inert gas, such as He, $N_2$, Ar, or 5% $H_2$ in 95% $N_2$ may be used to purge the reactor.

Next, a metal precursor may be pulsed into the reactor (512). The metal precursor may also be chosen from the precursors provided above. The metal precursor delivery line into the reactor may be heated to a temperature that ranges from 25° C. to 150° C., or alternately, to a temperature that is at least 25° C. hotter than the volatile metal precursor flow temperature within the delivery line to avoid condensation. The metal precursor pulse may have a time duration that ranges from 1 second to 20 seconds, a concentration that ranges from 4% to 100%, a flowrate that ranges from 0.5 SLM to 5 SLM, and a wafer temperature that ranges from 50° C. to 400° C. Another reactor purge may follow the metal precursor (514). As noted above, providing separate silicon and metal precursors enables predetermined silicon-to-metal ratios to be generated within the Si-alloy layer, thereby fabricating a Si-alloy layer with known silicon and metal quantities.

Finally, a co-reactant may be pulsed into the reactor (516). The co-reactant may consist of materials including but not limited to $H_2$, $SiH_4$, $NH_3$, $N_2H_4$, $B_2H_6$, 5% $H_2$ in 95% $N_2$, $CH_4$, and CO. The co-reactant delivery line into the reactor may be heated to a temperature that ranges from 25° C. to 150° C., or alternately, to a temperature that is at least 25° C. hotter than the volatile co-reactant flow temperature within the delivery line to avoid condensation. The co-reactant pulse may have a time duration that ranges from 1 second to 20 seconds, a concentration that ranges from 4% to 100%, a flowrate that ranges from 0.5 SLM to 5 SLM, and a wafer temperature that ranges from 50° C. to 400° C. The co-reactant pulse may be followed by another reactor purge (518).

Under these ALD process conditions, the silicon precursor, metal precursor, and co-reactant react to form a $M_x SiN$ material on the substrate. The process cycle described here may be repeated numerous times to fabricate a Si-alloy layer of the appropriate thickness (520).

In an alternate implementation of the invention, a single precursor containing both silicon and metal may be used in lieu of separate silicon and metal precursors. Precursors containing both metal and silicon are described above as well. In some implementations, a plasma may be generated similar to the ALD or CVD deposition processes described above. For instance, a plasma or activated species for either one or both of the precursor and co-reactant may be used. As described above, a plasma discharge may be developed using a 13.56 MHz, 27 MHz, or 60 MHz RF power generator, and the plasma may be operated with a power density from 0.01 $W/cm^2$ to 10 $W/cm^2$.

Figure 6:
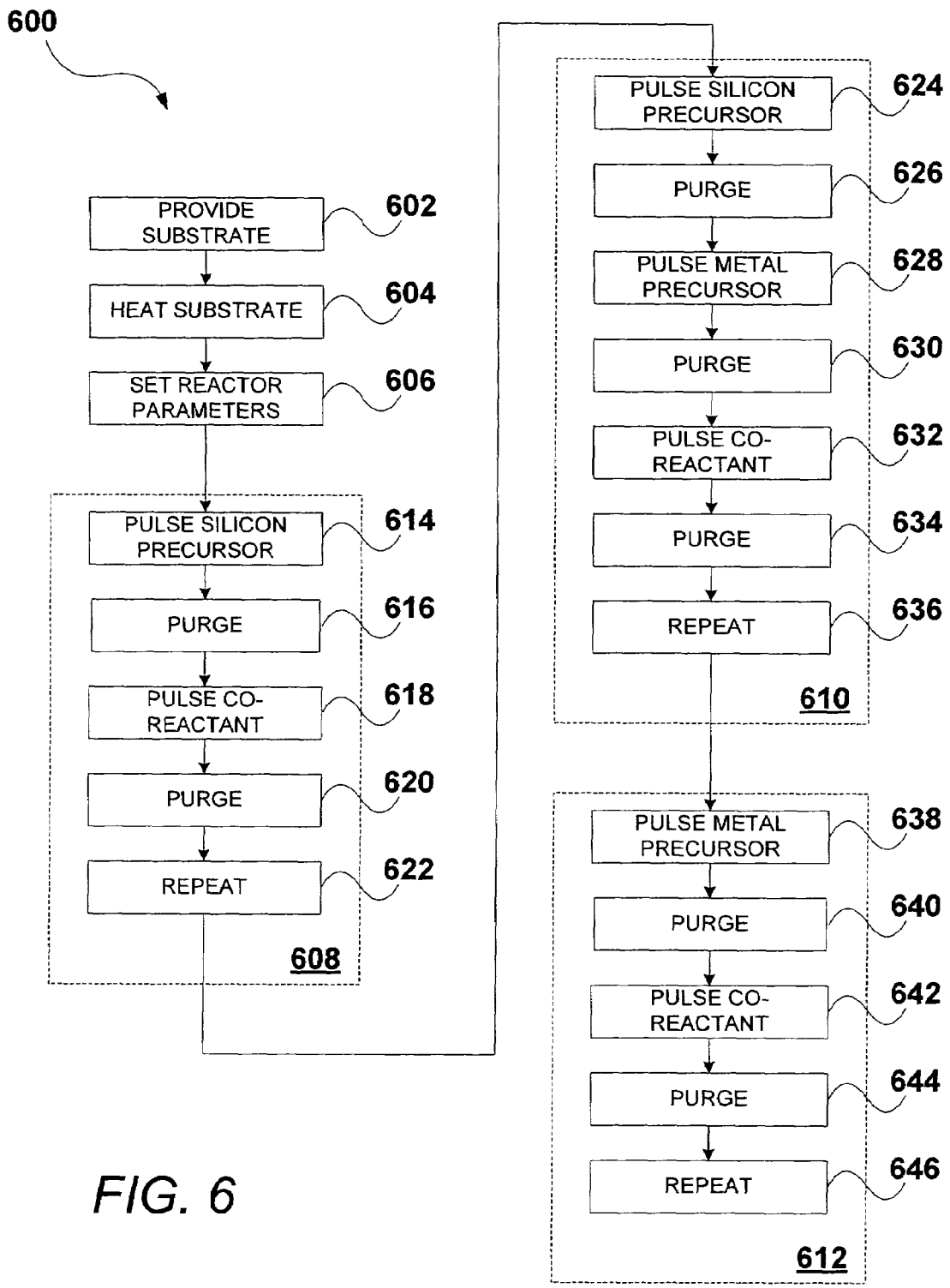
FIG. 6 is an ALD method for fabricating a graded Si-alloy layer in accordance with an implementation of the invention.

FIG. 6 is an ALD method 600 for fabricating a graded Si-alloy layer 200B in accordance with an implementation of the invention. First, a substrate is provided in a reactor (602). The substrate may include, but is not limited to, a semiconductor wafer having at least one dielectric layer deposited on its surface. The dielectric layer may include one or more trenches and/or vias within which the Si-alloy layer will be deposited and the copper interconnect will be formed.

In implementations of the invention, the substrate may be heated to a temperature that ranges from 50° C. to 400° C. (604). In addition, the process parameters for the reactor may be set, such as heating the reactor to a temperature that ranges from 50° C. to 400° C. and establishing a pressure within the reactor that ranges from 0.1 Torr to 10 Torr (606).

Next, multiple process cycles are carried out in which multiple precursors and at least one co-reactant are introduced into the reactor to react and form a graded Si-alloy layer. Each precursor and each co-reactant may be introduced in separate pulses and the reactor is generally purged between pulses. In one implementation of the invention, a first process cycle 608 may be executed multiple times to generate a SiN-rich material on the dielectric layer of the substrate. A second process cycle 610 may then be executed multiple times to deposit a $M_x SiN$-rich material on the SiN-rich material. Finally, a third process cycle 612 may be executed multiple times to deposit a metal-rich material on the $M_x SiN$-rich material.

The first process cycle 608 may begin with a pulse of a silicon precursor (614). The silicon precursor may be chosen from the precursors provided above. The precursor delivery line into the reactor may be heated to a temperature from 25° C. to 150° C., or alternately, to a temperature at least 25° C. hotter than the volatile silicon precursor flow temperature. The silicon precursor pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The reactor may be purged after the silicon precursor pulse (616). An inert gas, such as He, $N_2$, Ar, or 5% $H_2$ in 95% $N_2$ may be used to purge the reactor.

Next, a co-reactant may be pulsed into the reactor (618). The co-reactant may consist of materials including but not limited to $H_2$, $SiH_4$, $NH_3$, $N_2H_4$, $B_2H_6$, 5% $H_2$ in 95% $N_2$, $CH_4$, and CO. The co-reactant delivery line into the reactor may be heated to a temperature from 25° C. to 150° C., or alternately, to a temperature at least 25° C. hotter than the volatile co-reactant flow temperature. The co-reactant pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The co-reactant pulse may be followed by another reactor purge (620).

Under these ALD process conditions, the silicon precursor and co-reactant react to form a SiN material on the substrate. In one implementation of process cycle 608, the silicon precursor pulse may be a one second pulse of $SiCl_4$, $Si(NMe_2)_4$, or $SiH_4$. This silicon precursor pulse may be followed by a reactor purge. Next, a one second pulse of a co-reactant such as $NH_3$ or $N_2H_4$ may be introduced into the reactor. The co-reactant reacts with the silicon precursor to generate a Si-rich, and optionally nitrogen-containing, material on the dielectric layer. The process cycle 608 may be repeated multiple times until the silicon-rich material is built up to a desired thickness (622). In some implementations, the process cycle 608 may be repeated 50 times or more.

The second process cycle 610 may begin with a pulse of a silicon precursor (624). The silicon precursor delivery line into the reactor may be heated to a temperature from 25° C. to 150° C., or alternately, to a temperature at least 25° C. hotter than the volatile silicon precursor flow temperature. The silicon precursor may be chosen from the precursors provided above. The silicon precursor pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The reactor may be purged with an inert gas after the silicon precursor pulse (626).

Next, a metal precursor may be pulsed into the reactor (628). The metal precursor may also be chosen from the precursors provided above. The metal precursor delivery line into the reactor may be heated to a temperature from 25° C. to 150° C., or alternately, to a temperature at least 25° C. hotter than the volatile metal precursor flow temperature. The metal precursor pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. Another reactor purge may follow the metal precursor (630).

Finally, a co-reactant may be pulsed into the reactor (632). The co-reactant may consist of materials including but not limited to $H_2$, $SiH_4$, $NH_3$, $N_2H_4$, $B_2H_6$, 5% $H_2$ in 95% $N_2$, $CH_4$, and CO. The co-reactant delivery line into the reactor may be heated to a temperature from 25° C. to 150° C., or alternately, to a temperature at least 25° C. hotter than the volatile co-reactant flow temperature. The co-reactant pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The co-reactant pulse may be followed by another reactor purge (634).

Under these ALD process conditions, the silicon precursor, metal precursor, and co-reactant react to form a $M_xSiN$ material on the substrate. In one implementation of process cycle 610, the silicon precursor pulse may be a one second pulse of a silane such as SiMe. The SiMe pulse may be followed by a reactor purge. Next, a one second pulse of a metal precursor such as an aluminum precursor may be introduced into the reactor. The metal precursor pulse may be followed by a reactor purge. Finally, a one second pulse of a co-reactant such as $NH_3$ or $N_2H_4$ may be introduced into the reactor. The co-reactant reacts with the silicon and metal precursors to generate a Si-metal alloy (such as a $M_xSiN$ alloy) on the Si-rich material previously deposited by process cycle 608. The process cycle 610 may be repeated multiple times until the Si-metal alloy is built up to a desired thickness (636).

Finally, the third process cycle 612 may begin with a pulse of a metal precursor (638). The metal precursor may be chosen from the precursors provided above. The metal precursor delivery line into the reactor may be heated to a temperature from 25° C. to 150° C., or alternately, to a temperature at least 25° C. hotter than the volatile metal precursor flow temperature. The metal precursor pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The reactor may be purged after the metal precursor pulse (640). An inert gas, such as He, $N_2$, Ar, or 5% $H_2$ in 95% $N_2$ may be used to purge the reactor.

Next, a co-reactant may be pulsed into the reactor (642). The co-reactant may consist of materials including but not limited to $H_2$, $SiH_4$, $NH_3$, $N_2H_4$, $B_2H_6$, 5% $H_2$ in 95% $N_2$, $CH_4$, and CO. The co-reactant delivery line into the reactor may be heated to a temperature from 25° C. to 150° C., or alternately, to a temperature at least 25° C. hotter than the volatile co-reactant flow temperature. The co-reactant pulse may have a time duration that ranges from 1 second to 20 seconds, a concentration that ranges from 4% to 100%, a flowrate that ranges from 0.5 SLM to 5 SLM, and a temperature that ranges from 50° C. to 400° C. The co-reactant pulse may be followed by another reactor purge (644).

Under these ALD process conditions, the metal precursor and co-reactant react to deposit a metal on the substrate. In one implementation of process cycle 612, a one second pulse of a metal precursor such as an aluminum precursor may be introduced into the reactor. The metal precursor pulse may be followed by a reactor purge. Then a one second pulse of a co-reactant such as $NH_3$ or $N_2H_4$ may be introduced into the reactor. The co-reactant reacts with the metal precursor to generate a metal on the $M_xSiN$ material previously deposited by process cycle 610. The process cycle 612 may be repeated multiple times until the metal is built up to a desired thickness (646).

In various implementations of the invention, the process cycles described above to form the graded Si-alloy layer using a CVD or ALD process may be tailored to include different amounts of silicon, metal, and nitrogen in each of the graded portions of the final Si-alloy layer than what is described in FIGS. 4 and 6. For instance, the process cycle 608 of FIG. 6 used to form the SiN portion adjacent to the dielectric layer may be modified to add a quantity of metal. In one such implementation of the invention, the process cycle 608 may include pulses of metal precursor in addition to the silicon precursor and co-reactant. The process cycle 608 may deposit more silicon than metal by using a greater number of silicon precursor pulses or by using silicon precursor pulses of a longer time duration. In one implementation, for example, the process cycle 608 may use a five second pulse of a silicon precursor, a one second pulse of a metal precursor, and a one to five second pulse of a co-reactant. These three pulses would be separated by the appropriate purges. The result would be a $Si_xN_yM_z$ material that consists of silicon and nitrogen with a quantity of metal mixed in.

Similarly, the process cycle 408 of FIG. 4 may be modified to include a metal precursor input stream in addition to the silicon precursor and co-reactant input streams. The metal precursor may be introduced at a lower flowrate or lower concentration than the silicon precursor to ensure that there is more silicon than metal in this portion of the Si-alloy layer. As will be appreciated by those of skill in the art, many variations of the process cycles 408 and 608 may be used to introduce metal into the SiN portion of the Si-alloy layer.

In other implementations of the invention, the metal portion adjacent to the metal interconnect may include some quantity of silicon. In one such implementation of the invention, the ALD process cycle 612 of FIG. 6 may include pulses of silicon precursor in addition to the metal precursor and co-reactant. The process cycle 612 may deposit more metal than silicon by using more metal pulses than silicon pulses, or by using metal precursor pulses of a longer time duration. In one implementation, for example, the process cycle 612 may use a one second pulse of a silicon precursor, a five second pulse of a metal precursor, and a one second pulse of a co-reactant. These three pulses would be separated by the appropriate purges. The result would be a metal portion that contains a small quantity of silicon.

Similarly, the CVD process cycle 412 of FIG. 4 may be modified to include a silicon precursor input stream in addition to the metal precursor and co-reactant input streams. The silicon precursor may be introduced at a lower flowrate or lower concentration than the metal precursor to ensure that there is more metal than silicon in this portion of the Si-alloy layer. As will be appreciated by those of skill in the art, many variations of the process cycles 412 and 612 may be used to introduce silicon into the metal portion of the Si-alloy layer.

In still further implementations of the invention, the CVD and ALD process cycles used to form the Si-alloy layer may be modified more often than the methods described above in order to form more linear concentration gradients of silicon and metal in the Si-alloy layer. In one such implementation, a series of process cycles may be used in which the silicon precursor concentration gradually decreases in each subsequent process cycle of the series while the metal precursor concentration gradually increases in each subsequent process cycle of the series. This implementation produces a Si-alloy layer having linear concentration gradients of silicon and metal.

Figure 7:
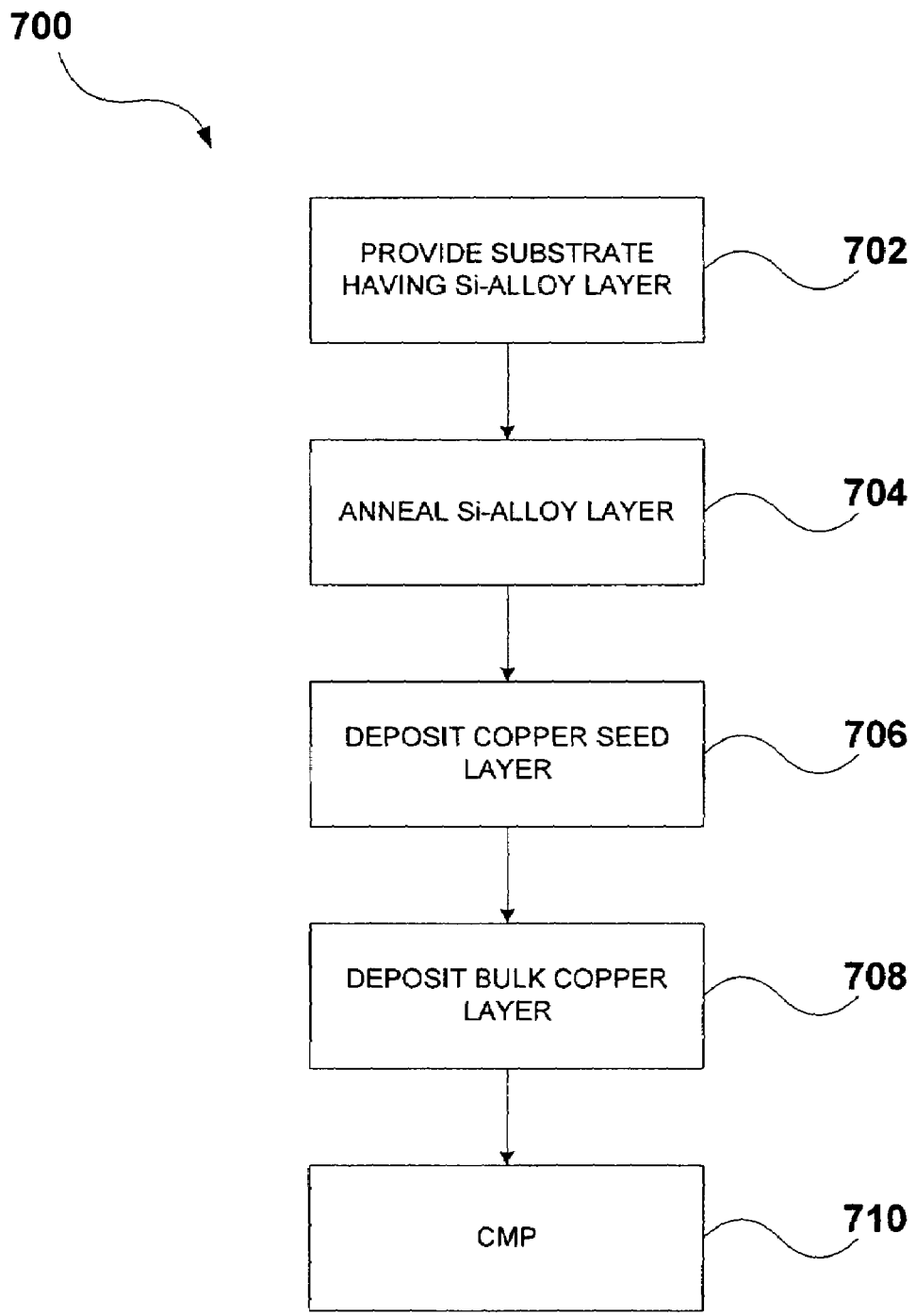
FIG. 7 is a method of forming a metal interconnect using a Si-alloy layer formed in accordance with implementations of the invention.

FIG. 7 is a method 700 of forming a metal interconnect using a Si-alloy layer formed in accordance with implementations of the invention. First, a substrate is provided upon which a dielectric layer is formed that includes a trench and a Si-alloy layer formed within the trench (702). The Si-alloy layer may be fabricated in accordance with one of the processes described above in FIGS. 3 through 6.

The Si-alloy layer may be annealed to increase metal or silicon segregation or to improve composition uniformity (704). The annealing process may utilize a laser process, a plasma process, or a temperature process. In some implementations, the anneal may heat the Si-alloy layer to a temperature that ranges from 100° C. to 450° C. for a time duration of 0.5 minutes to 240 minutes.

A metal interconnect may then be formed atop the Si-alloy layer. In some implementations of the invention, a copper seed layer may first be deposited on the Si-alloy layer using an electroless deposition process or an ALD/CVD process (706). The copper seed layer deposition is an optional process, depending on whether the Si-alloy layer can adequately function as a seed layer.

A bulk metal layer may then be deposited to form the metal interconnect (708). The bulk metal layer generally consists of a bulk copper layer. Conventional processes to deposit copper may be used, including but not limited to electroless plating, electroplating, reflow, PVD, CVD, or ALD methods. Typically an electroplating process is used. If a copper seed layer has been deposited, the bulk copper layer may be deposited on the copper seed layer. Alternately, if the metal-rich portion of the Si-alloy layer is conductive enough to function as a seed layer, the bulk copper layer may be deposited directly on the Si-alloy layer. A chemical mechanical polishing process may be used after the deposition process to planarize the deposited copper, allowing for the formation of the interconnect structure (710).

Accordingly, a novel Si-alloy layer has been described that may be used in the formation of an interconnect structure in place of the conventional TaN/Ta or TaN/Ru stack. The Si-alloy layer described in implementations of the invention enables an ALD or CVD process to be used to form an alloy film directly from a single precursor. As device dimensions scale down and aspect ratios become more aggressive, the thinness of the Si-alloy layer enables metal interconnects to be formed in using known electroless plating and electroplating processes without issues such as trench overhang and pinched-off trench openings. The thinness of the Si-alloy layer also decreases the ratio of barrier metal to copper metal in the overall interconnect structure, thereby decreasing the electrical line resistance and RC delay of the interconnect.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
   a substrate;
   a dielectric layer formed on the substrate that includes a trench;
   a graded silicon alloy layer formed conformally along a bottom surface and sidewalls of the trench, the graded silicon alloy comprising a graded concentration of metal across its thickness, a graded concentration of silicon across its thickness, and a graded concentration of nitrogen across its thickness; and
   a metal interconnect formed within the trench atop the graded silicon alloy layer;
   wherein the graded concentration of silicon in the graded silicon alloy layer is highest proximate a surface of the graded silicon alloy layer that is adjacent to the dielectric layer and lowest proximate a surface of the graded silicon alloy layer that is adjacent to the metal interconnect.

2. An apparatus comprising:
   a substrate;
   a dielectric layer formed on the substrate that includes a trench;
   a graded silicon alloy layer formed conformally along a bottom surface and sidewalls of the trench, the graded silicon alloy comprising a graded concentration of metal across its thickness, a graded concentration of silicon across its thickness, and a graded concentration of nitrogen across its thickness; and
   a metal interconnect formed within the trench atop the graded silicon alloy layer;
   wherein the graded concentration of nitrogen in the graded silicon alloy layer is highest proximate a surface of the graded silicon alloy layer that is adjacent to the dielectric layer and lowest proximate a surface of the graded silicon alloy layer that is adjacent to the metal interconnect.

3. An apparatus comprising:
   a substrate;
   a dielectric layer formed on the substrate that includes a trench;
   a graded silicon alloy layer formed conformally along a bottom surface and sidewalls of the trench, the graded silicon alloy comprising a graded concentration of metal across its thickness, a graded concentration of silicon across its thickness, and a graded concentration of nitrogen across its thickness; and
   a metal interconnect formed within the trench atop the graded silicon alloy layer;
   wherein the graded concentration of the metal in the graded silicon alloy layer is highest proximate a surface of the graded silicon alloy layer that is adjacent to the metal interconnect and lowest proximate a surface of the graded silicon alloy layer that is adjacent to the dielectric layer.

4. The apparatus of claim 3, wherein the metal is selected from the group consisting of copper, aluminum, ruthenium, iridium, cobalt, titanium, or tantalum.

5. The apparatus of claim 3, wherein the graded silicon alloy layer is formed from multiple layers.

* * * * *